United States Patent
Douts et al.

(10) Patent No.: US 7,193,457 B2
(45) Date of Patent: Mar. 20, 2007

(54) CURRENT-MODE INSTRUMENTATION AMPLIFIER GAIN ERROR CORRECTION CIRCUITRY

(75) Inventors: Benjamin A. Douts, Tucson, AZ (US); Thomas L. Botker, Tucson, AZ (US)

(73) Assignee: Analog Devices, Inc., Norwood, MA (US)

(*) Notice: Subject to any disclaimer, the term of this patent is extended or adjusted under 35 U.S.C. 154(b) by 100 days.

(21) Appl. No.: 11/154,137

(22) Filed: Jun. 15, 2005

(65) Prior Publication Data

US 2005/0275453 A1    Dec. 15, 2005

Related U.S. Application Data

(60) Provisional application No. 60/580,295, filed on Jun. 15, 2004.

(51) Int. Cl.
   *H03F 1/02* (2006.01)
(52) U.S. Cl. .......................... 330/9; 330/292
(58) Field of Classification Search ............ 330/92, 330/292
   See application file for complete search history.

(56) References Cited

U.S. PATENT DOCUMENTS 6,538,503 B2 *   3/2003   Burt .................. 330/9

* cited by examiner

*Primary Examiner*—Robert Pascal
*Assistant Examiner*—Hieu Nguyen
(74) *Attorney, Agent, or Firm*—Koppel, Patrick, Heybl & Dawson

(57) ABSTRACT

A chopper-stabilized current-mode instrumentation amplifier comprises first and second input amplifiers coupled to respective input nodes and arranged to produce respective currents in response to a differential input voltage applied to the input nodes; the currents are coupled to an output node. To reduce gain errors that might otherwise arise due to the parasitic capacitances of the on- and/or off-chip devices and/or structures making up the input amplifiers, the invention includes gain correction circuitry coupled to the IA. The gain correction circuitry replicates at least some of the parasitic capacitances, and provides compensation currents to the IA which reduce both input- and output-referred gain errors that might otherwise arise.

9 Claims, 2 Drawing Sheets

CURRENT-MODE INSTRUMENTATION AMPLIFIER GAIN ERROR CORRECTION CIRCUITRY

This application claims the benefit of provisional patent application No. 60/580,295 to Botker et al., filed Jun. 15, 2004.

BACKGROUND OF THE INVENTION

1. Field of the Invention

This invention relates to the field of instrumentation amplifiers (IAs), and particularly to circuits and methods for reducing IA gain errors.

2. Description of the Related Art

All amplifiers have an associated gain specification. For some applications it is important that the gain be precisely known and repeatable from IC to IC. Instrumentation amplifiers (IAs) are one such application.

Many techniques are employed to reduce or eliminate sources of error that may affect an IA's gain. One such technique is "chopper-stabilization". An exemplary chopper-stabilized IA topology is shown in FIG. 1; this IA is described in more detail in co-pending patent application [TBD] 11/154,135. The IA includes two input amplifiers: an input amp 8 comprises FETs MP1, MN1 and MN3, along with current sources 10, 12, 14 and 16, and an input amp 17 comprises FETs MP2, MN2, MN5, and current sources 18, 20, 22 and 24. Assuming there are no device mismatches, the differential input voltage (VINP-VINN) appears across nodes VO1 and VO2, and is applied across a resistor 26 having a resistance R1. In addition to the quiescent current, the resulting current in R1 ($I_{R1}$), which varies with VINP-VINN, will flow through MN1 and MN2. This results in currents at nodes IO1 and IO2 which are applied to FETs MN4/MN3 and MN6/MN5, respectively, which form virtual ground nodes that fold current variations in MN1 and MN2 back around to an output node 28, which is connected to ground via a resistor 30 having a resistance R2. Because each of FETs MN4 and MNE carries the signal current from R1, the current that flows into R2 is twice the value that flows into R1. Consequently, the voltage gain of this current-mode topology is G =2* (R2/R1).

The two input amplifiers are chopper-stabilized. Using switches 32a/32b, 34a/34b and 36a/36b, the two input amplifiers change positions when the switches are toggled, which eliminates DC voltage mismatches within the input amplifiers. Mismatches in the current sources are also chopped out, so that the average current in R2 with no signal is zero.

However, this topology does have a drawback: when a differential input signal is applied to VINP and VINN, the parasitic capacitances (CP1,CP2) present on the IA's "gain setting" nodes VO1 and VO2 result in a gain error. Assume, for example, that VINP is at 2 volts and VINN is at 1 volt. When the left-most amplifier switches from the 1 volt input to the 2 volt input, parasitic capacitance CP1 must be charged. This reduces the amount of current in MN1, which increases the current in MN4 and current mirror FET MP3, which are connected in series. This increased current is mirrored to MP4, resulting in an increase in the MP4 current that is proportional to the size of parasitic capacitance CP1 and the differential input voltage. At the same time, the right-most amplifier switches from the 2 volt input to the 1 volt input. Here, parasitic capacitance CP2 must be discharged, which increases the amount of current in MN2 and decreases the amount of current in MN6. These two effects in unison increase the amount of current flowing into R2. If the input voltages are reversed, the effect is similar, but the result is a decrease in current in MP4 and an increase in current in MN6. This results in a decrease in current flowing into R2. This variation in the R2 current due to CP1 and CP2 results in a gain error, which is proportional to the size of CP1 and CP2 as well as the chopping frequency. This switched parasitic capacitance looks like a resistor of value $R_{eq}=1/(2*f*C)$, where f is the chopping frequency and C is the parasitic capacitance. This equivalent resistance is in parallel with R1.

The value selected for R1 must be large enough so that the current it diverts from the input amplifiers will not turn off any of the devices in the amplifiers. This is a significant problem with large input signals, so the value of R1 is typically chosen to be larger for small values of G than for high G values where the input signal range is more limited. Because the value of R1 is larger for small gain configurations, the effect of equivalent resistance $R_{eq}$ is particularly adverse when the IA is configured for a small G value.

Parasitic capacitances on any other on- or off-chip circuit node that changes voltages as a result of the chopping process can give rise to similar errors in the IA amplifier's gain. For example, an input amplifier's transistors, capacitors, resistors, metal traces, bond pads and inductors can all have associated parasitic capacitances that give rise to gain errors when the IA is chopped.

SUMMARY OF THE INVENTION

Gain error correction circuitry is presented which reduces parasitic capacitance-related gain errors when coupled to a chopper-stabilized current-mode IA.

A chopper-stabilized current-mode IA in accordance with the present invention comprises first and second input amplifiers coupled to respective input nodes and arranged to produce respective currents in response to a differential input voltage applied to the input nodes; the currents are coupled to an output node. Each input amplifier includes a plurality of devices and/or structures having associated parasitic capacitances. When the IA is chopped, these devices and/or structures produce respective currents that can cause the IA's gain value to deviate from a desired value.

To reduce gain errors that might otherwise arise due to the parasitic capacitances of the on- and/or off-chip devices and/or structures making up the input amplifiers, gain correction circuitry is coupled to the IA. The gain correction circuitry is arranged to replicate at least some of the parasitic capacitances, and to provide compensation currents to the IA which reduce both input- and output-referred gain errors that might otherwise arise.

The gain correction circuit preferably comprises a plurality of devices (e.g., transistors, resistors, capacitors), each of which corresponds to a respective device and/or structure in an input amplifier, with each gain correction device and its corresponding input amplifier device or structure having similar characteristics.

Further features and advantages of the invention will be apparent to those skilled in the art from the following detailed description, taken together with the accompanying drawings.

DETAILED DESCRIPTION OF THE INVENTION

The present invention provides a means for correcting both input- and output-referred gain errors in a chopper-stabilized current mode IA. This is accomplished with gain correction circuitry which is coupled to the IA, and includes devices which replicate the parasitic capacitances of corresponding on- and/or off-chip devices and/or structures that are part of the IA. The replica devices are used to produce compensating currents that are injected back into the IA to correct both input- and output-referred gain errors.

The use of gain correction circuitry as described herein is generally applicable for correcting parasitic capacitance-related gain errors of any chopper-stabilized current mode IA. However, though the principles of the invention have a general applicability, the gain correction circuitry requires the employment of replica devices to produce the necessary compensating currents; as such, the implementation of the gain correction circuitry will vary depending on the implementation of the particular IA being corrected. Thus, for purposes of illustration, a specific IA implementation is described herein, as well as a gain correction circuitry implementation suitable for use with that particular IA. However, the invention is not limited to use with the described IA and gain correction circuitry —the principles of the invention can be applied to derive an appropriate gain correction circuitry implementation for any given chopper-stabilized current mode IA.

Figure 1:
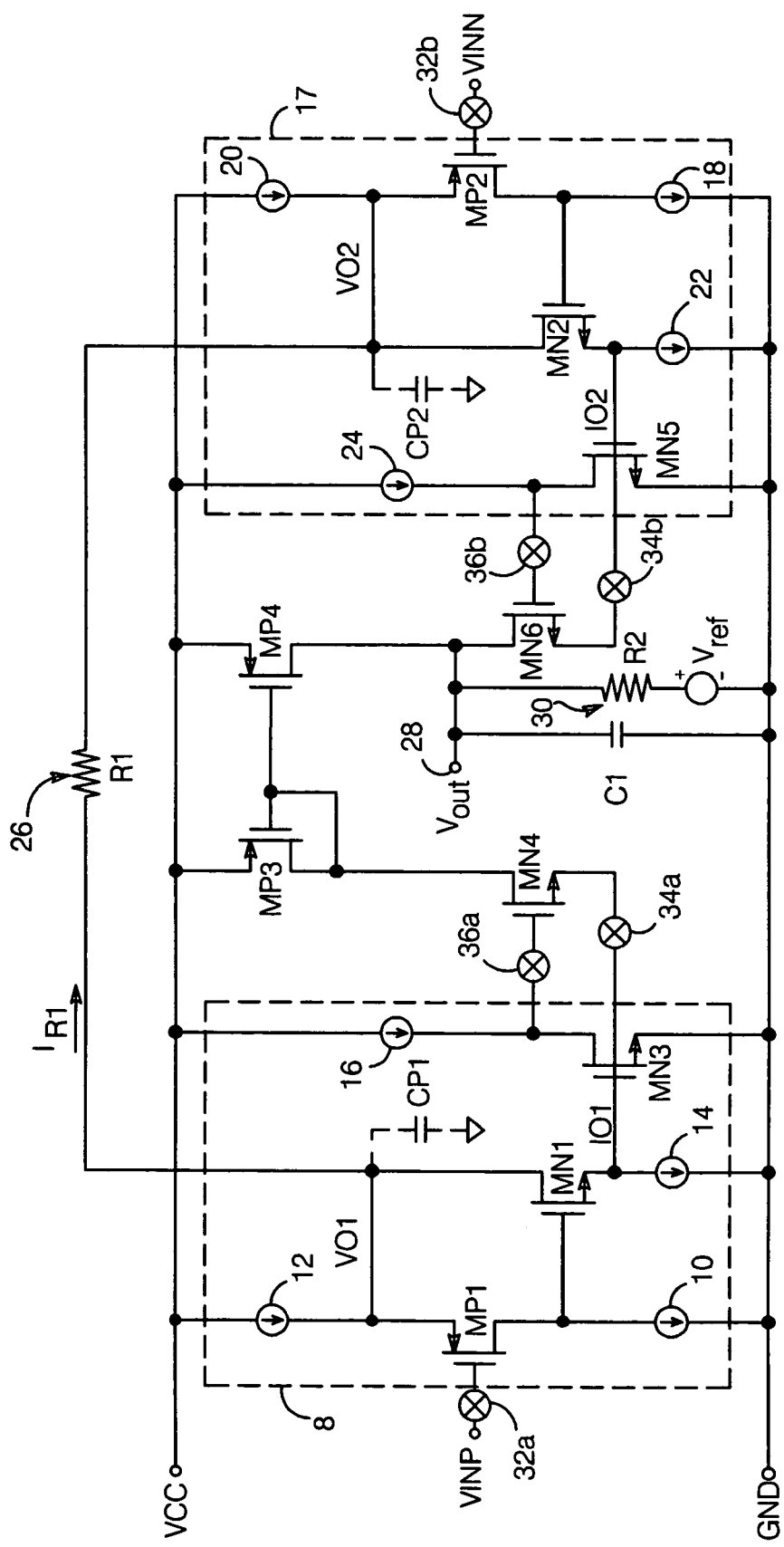
FIG. 1 is a schematic diagram of a chopper-stabilized current-mode IA.
Figure 2:
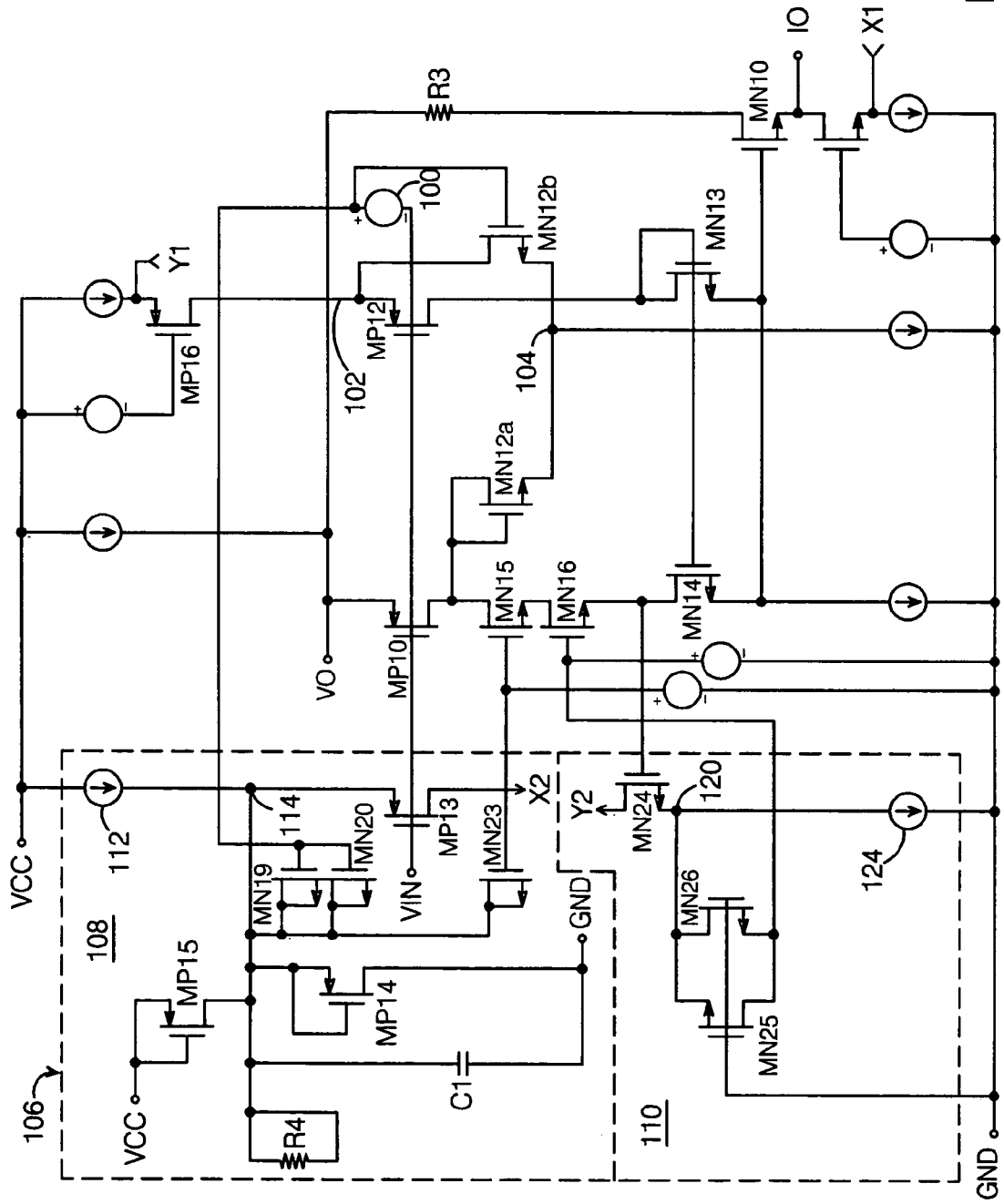
FIG. 2 is a schematic diagram of an input amplifer as might be used with a chopper-stabilized current-mode IA, along with gain error correction circuitry per the present invention.

A more accurate implementation of an input amplifier like amplifiers 8 and 17 in FIG. 1 is shown in FIG. 2. Amplifier FETs MP1/MN1 in FIG. 1 are analogous to FETs MP10 and MN10 in FIG. 2, and nodes VO and IO are analogous to nodes VO1 (or VO2) and IO1 (or IO2) in FIG. 1.

The drain voltage of MP10 is set by a cascading loop coupled to the gate and drain of MP10 and arranged such that the $V_{gs}$ of MP10 is maintained approximately constant. FETs MN12a, MN12b, MP12, MN13 and MN14 are preferably added to provide the cascading loop. To implement this cascoding, a fixed voltage source 100 is connected between VIN and the gate of MN12b. The source of MN12b is connected to the source of MN12a, forming a differential pair. This pair controls the current in MN13 which in turn regulates the drain voltage of MP10 by controlling MN14. The drain voltage of MP10 is forced to be approximately equal to the gate voltage of MN12b. Cascode FETs MN15–MN16 are preferably included to minimize the drain-source voltage of MN14.

As noted above, a gain error is caused by parasitic capacitances on the gain setting resistor nodes (VO). Similar gain errors are caused by capacitances on other nodes that change voltage in response to the chopping of the input signal, such as node 102 at the source of MP12, node 104 at the common source of MN12a/MN12b, and the drain of MP10. When a differential signal is applied to the IA's inputs, each of these nodes is chopped between two voltages, forming a square wave pattern with peak-to-peak amplitude equal to the differential voltage input. Other devices and/or structures, either on- or off-chip, including but not limited to transistors, capacitors, resistors, metal traces, bond pads and inductors, could also have associated parasitic capacitances which produce respective currents when the IA is chopped and cause gain G to deviate from its desired value.

To reduce these parasitic capacitance-related gain errors, the IA includes gain correction circuitry 106 coupled to one of the IA's input amplifiers; gain correction circuitry identical to circuitry 106 would be connected to the IA's other input amplifier. Circuitry 106 is coupled to an input amplifier and arranged to replicate at least some of the parasitic capacitances and to provide compensation currents to the IA—specifically, to the signal path associated with the "opposite" input amplifier—which reduce gain errors that would otherwise arise due to the parasitic capacitances. The gain correction circuitry includes a plurality of devices, each of which corresponds to a respective one of the input amplifier devices and/or structures having associated parasitic capacitances, with each gain correction circuitry device and its corresponding device and/or structure having similar characteristics.

One possible gain correction circuitry implementation suitable for use with the IA input amplifier shown in FIG. 2 includes a first portion 108 and a second portion 110. Portion 108 is useful regardless of common-mode input voltage. Portion 108 includes a FET MP13 having its gate connected to the input voltage VIN applied to the input amplifier's input terminal (i.e., the gate of MP10), and its source connected to the output of a fixed current source 112. When so arranged, the voltage at the source of MP13 (a node 114) is a square wave which nearly matches the waveform seen on nodes VO, 102, 104 and the drain of MP10. Each of the devices connected to node 114 replicates a device capacitance that exists on one of the input amplifier nodes that follows the input signal. As a result, a compensating current can be produced with MP13 and the replica device capacitances. This current should be nearly equal to the error current produced in the input amplifier. The current from the drain of MP13 (provided at the node labeled 'X2') serves as the output of gain correction circuitry portion 108, with the current provided there injected into a current source that ties to the IO node of the "opposite" input amplifier (not shown) to correct for this error term, and from there into the virtual ground node (assuming an IA implementation similar to that shown in FIG. 1); the injection point would correspond to the node labeled X1 in FIG. 2. This current consists of the DC current fed into node 114 plus the current that flows into or out of the parasitic capacitors. Because this is a current-mode topology, the charge removed from (or fed into) the opposite input amplifier by the correction circuit simply needs to match the charge stored in the parasitic capacitances in the first input amplifier.

In this exemplary embodiment, the replica devices and the input amplifier devices or structures to which they correspond are as follows:

MP13 corresponds to IA device MP10

MN19 corresponds to MN12a

MN20 corresponds to MN12b

MP14 corresponds to MP12 resistor R4 corresponds to R3 capacitor C1 corresponds to the typical capacitance on node VO due to the PC board and gain resistor R1

MP15 accounts for the capacitance of current source FET MP16 which provides current to MP12

MN23 accounts for the drain of MN15, and may provide a little extra capacitance to account for the fact that the source of MN15 will be moving at some times. Note that the characteristics of the replica devices and those of the devices or structures to which they correspond should be as similar as possible.

Another operating condition for which the illustrated gain correction circuitry is particularly beneficial is when one or both of the IA inputs is low. At a certain input level, the drain voltages of MN15 and MN16 will place these devices in the triode region of operation. When this happens, the voltages at the source and drain of MN16 can vary at the clock rate when a differential input voltage is applied. This requires periodic charging and discharging of parasitic capacitances on these nodes. This causes an undesired output-referred current flow. An additional harmful effect is that the additional current flow modulates the current in the input device (MP10) and thereby modulates the $V_{gs}$ of MP10. This appears as an input-referred voltage error in the input amplifier. Gain correction circuitry portion 110 is intended to account for this operating condition.

Gain correction circuitry portion 110 includes a FET MN24 connected to the source of MN16 in the input amplifier. A node 120 at the source of MN24 is connected to a fixed current source 124, such that the source voltage of MN24 follows the source voltage of MN16. FETs MN25 and MN26 replicate capacitances at the source of MN16, with the correspondence being as follows:

MN25 corresponds to MN16
MN26 corresponds to MN14

As noted above, the characteristics of the replica devices and those of the devices or structures to which they correspond should be as similar as possible.

When so arranged, the DC bias current along with the capacitor charging current that flows in MN24 appears at node Y2, which is injected into the tail current provided to FET MP12 of the "opposite" input amplifier (not shown); the injection point would correspond to the node labeled Y1 in FIG. 2. This causes the correction current to flow through input device MP10 of the opposite amplifier. This current corrects gain error in the same manner as gain correction circuitry portion 108.

The fact that the correction current flows through the opposite input device also helps to counteract the effects of $V_{gs}$ modulation of the input device drain currents. Any change in the input device $V_{gs}$ of the first input amplifier should be replicated in the input device of the second input amplifier because the correction current also flows through the opposite amplifier's input device. Thus, the correction current increases or decreases the current that flows through MP10 of the opposite amplifier, and in turn increases or decreases the current that flows out of the opposite amplifier's IO node. This is significant, in that both input- and output-referred gain errors are corrected by gain correction circuitry portion 110.

Thus, the error correction current from gain correction circuitry portion 110 cancels input-referred gain errors, as well as the associated output error voltage due to that current, while gain correction circuitry portion 108 corrects output-referred gain errors.

Note that the input amplifier implementation and the implementation of the gain correction circuitry described herein is merely exemplary. The input amplifier of a chopper-stabilized current-mode IA could be implemented in a wide variety of ways, and the gain correction circuitry required to correct input- and output-referred gain errors that might otherwise arise due to parasitic capacitances is dependent on the particular input amplifier implementation. It is only essential that the gain correction circuitry be coupled to the IA and arranged to replicate at least some of its input amplifiers' inherent parasitic capacitances and to provide compensation currents to the IA which reduce gain errors that would otherwise arise due to the parasitic capacitances.

Also note that, though the input amplifiers and gain correction circuitry are described herein as being implemented with FETs, bipolar transistors could also be used—as long as the amplifier devices and/or structures and their corresponding replica devices have similar characteristics.

While particular embodiments of the invention have been shown and described, numerous variations and alternate embodiments will occur to those skilled in the art. Accordingly, it is intended that the invention be limited only in terms of the appended claims.

The invention claimed is:

1. A chopper-stabilized current-mode instrumentation amplifier (IA), comprising:
    first and second input nodes;
    an output node;
    first and second input amplifiers coupled to said first and second input nodes and arranged to produce respective currents in response to a differential input voltage applied to said first and second input nodes, said currents coupled to said output node, said IA having an associated desired gain value G, each of said input amplifiers comprising a plurality of on- and/or off-chip devices and/or structures having associated parasitic capacitances which produce respective currents when said IA is chopped that cause gain G to deviate from its desired value; and
    gain correction circuitry coupled to said IA and arranged to replicate at least some of said parasitic capacitances and to provide compensation currents to said IA which reduce gain errors that would otherwise arise due to said parasitic capacitances.

2. The IA of claim 1, wherein at least some of said associated parasitic capacitances result in input-referred errors in said desired gain value G, said gain correction circuitry arranged to reduce said input-referred gain errors.

3. The IA of claim 1, wherein at least some of said associated parasitic capacitances result in output-referred errors in said desired gain value G, said gain correction circuitry arranged to reduce said output-referred gain errors.

4. The IA of claim 1, wherein said gain correction circuitry includes a plurality of devices, each of which corresponds to a respective one of said input amplifier devices and/or structures having associated parasitic capacitances, each gain correction circuitry device and its corresponding device and/or structure having similar characteristics.

5. The IA of claim 4, wherein said gain correction circuitry comprises:
    a first correction circuit coupled to said first input amplifier and providing compensation currents to the signal path associated with said second input amplifier to reduce gain errors that would otherwise arise due to said first input amplifier's parasitic capacitances; and
    a second correction circuit coupled to said second input amplifier and providing compensation currents to the signal path associated with said first input amplifier to reduce gain errors that would otherwise arise due to said second input amplifier's parasitic capacitances.

6. The IA of claim 5, wherein said first input amplifier comprises an input field-effect transistor (FET) MP1, the gate of which is coupled to a respective one of said first and second input nodes and the source of which is connected to a node VO1, and said second input amplifier comprises an input FET MP2, the gate of which is coupled to the other of said first and second input nodes and the source of which is connected to a node VO2; said IA further comprising:

a resistance R1 connected between said nodes VO1 and VO2, said IA arranged such that R1 conducts a current IR1 which varies with the difference between the voltages applied to said first and second input nodes, said first and second input amplifiers arranged to provide respective currents at first and second output current nodes which vary with IR1, the currents at said first and second output current nodes coupled to said output node.

7. The IA of claim 6, wherein said first correction circuit is connected at an input to the gate of MP1 and arranged to provide a compensation current which is coupled to said second output current node, and said second correction circuit is connected at an input to the gate of MP2 and arranged to provide a compensation current which is coupled to said first output current node to reduce output-referred gain errors that might otherwise arise due to said parasitic capacitances.

8. The IA of claim 6, wherein said first correction circuit is coupled at an input to the drain of MP1 and arranged to provide a compensation current which modulates the current in MP2 to reduce input- and output-referred gain errors that might otherwise arise due to said parasitic capacitances, and said second correction circuit is coupled at an input to the drain of MP2 and arranged to provide a compensation current which modulates the current in MP1 to reduce input- and output-referred gain errors that might otherwise arise due to said parasitic capacitances.

9. The IA of claim 6, further comprising a cascading loop coupled to the gate and drain of MP1 and arranged such that the gate-source voltage of MP1 is maintained approximately constant, said cascading loop comprising a plurality of FETs, said gain correction circuitry including a plurality of FETs which correspond to respective ones of said cascading loop FETs, each of said gain correction circuitry FETs and their corresponding cascading loop FETs having similar device characteristics.

* * * * *